United States Patent [19]
Kato et al.

[11] Patent Number: 6,055,740
[45] Date of Patent: May 2, 2000

[54] VACUUM PROCESSING APPARATUS AND OPERATING METHOD THEREFOR

[75] Inventors: Shigekazu Kato, Kudamatsu; Kouji Nishihata, Tokuyama; Tsunehiko Tsubone, Hikari; Atsushi Itou, Kudamatsu, all of Japan

[73] Assignee: Hitachi, Ltd., Tokyo, Japan

[21] Appl. No.: 09/231,451

[22] Filed: Jan. 15, 1999

Related U.S. Application Data

[63] Continuation of application No. 09/061,062, Apr. 16, 1998, which is a continuation of application No. 08/882,731, Jun. 26, 1997, Pat. No. 5,784,799, which is a division of application No. 08/593,870, Jan. 30, 1996, Pat. No. 5,661,913, which is a continuation of application No. 08/443,039, May 17, 1995, Pat. No. 5,553,396, which is a division of application No. 08/302,443, Sep. 9, 1994, Pat. No. 5,457,896, which is a continuation of application No. 08/096,256, Jul. 26, 1993, Pat. No. 5,349,762, which is a continuation of application No. 07/751,951, Aug. 29, 1991, Pat. No. 5,314,509.

[30] Foreign Application Priority Data

Aug. 29, 1990 [JP] Japan ................................ 2-225321

[51] Int. Cl.[7] .................................................. F26B 13/30
[52] U.S. Cl. .................................................. 34/92; 34/228
[58] Field of Search .............................. 34/406, 92, 228, 34/229; 414/939, 940; 134/902; 156/646.1, 662.1

[56] References Cited

U.S. PATENT DOCUMENTS

| | | |
|---|---|---|
| 3,652,444 | 2/1972 | Lester et al. . |
| 3,981,791 | 9/1976 | Rosvold . |
| 4,138,306 | 2/1979 | Niwa ........................................ 156/345 |
| 4,226,897 | 10/1980 | Coleman . |
| 4,311,427 | 1/1982 | Coad et al. . |

(List continued on next page.)

FOREIGN PATENT DOCUMENTS

| | | |
|---|---|---|
| 20246453 | 4/1987 | European Pat. Off. . |
| 20381338 | 5/1990 | European Pat. Off. . |
| 60-246635 | 12/1985 | Japan . |
| 62-89881 | 4/1987 | Japan . |
| 62-207866 | 9/1987 | Japan . |
| 636582 | 1/1989 | Japan . |
| 6412037 | 1/1989 | Japan . |
| 131970 | 2/1989 | Japan . |
| 131971 | 2/1989 | Japan . |

(List continued on next page.)

OTHER PUBLICATIONS

R.P.H. Chang, "Multipurpose plasma reactor for materials research and processing", J. Vac Sci. Technol., vol. 14, No. 1, Jan./Feb. 1977, pp. 278–280.

*Primary Examiner*—Henry Bennett
*Assistant Examiner*—Steve Gravini
*Attorney, Agent, or Firm*—Antonelli, Terry, Stout & Kraus, LLP.

[57] ABSTRACT

This invention relates to a vacuum processing apparatus having vacuum processing chambers the insides of which must be dry cleaned, and to a method of operating such an apparatus. When the vacuum processing chambers are dry-cleaned, dummy substrates are transferred into the vacuum processing chamber by substrates conveyor means from dummy substrate storage means which is disposed in the air atmosphere together with storage means for storing substrates to be processed, and the inside of the vacuum processing chamber is dry-cleaned by generating a plasma. The dummy substrate is returned to the dummy substrate storage means after dry cleaning is completed. Accordingly, any specific mechanism for only the cleaning purpose is not necessary and the construction of the apparatus can be made simple. Furthermore, the dummy substrates used for dry cleaning and the substrates to be processed do not coexist, contamination of the substrates to be processed due to dust and remaining gas can be prevented and the production yield can be high.

29 Claims, 1 Drawing Sheet

6,055,740
Page 2

U.S. PATENT DOCUMENTS

| | | | |
|---|---|---|---|
| 4,313,783 | 2/1982 | Davies et al. . | |
| 4,313,815 | 2/1982 | Graves, Jr. et al. . | |
| 4,318,767 | 3/1982 | Hijikata et al. . | |
| 4,449,885 | 5/1984 | Hertel et al. . | |
| 4,457,661 | 7/1984 | Flint et al. . | |
| 4,534,314 | 8/1985 | Ackley . | |
| 4,563,240 | 1/1986 | Shibata et al. . | |
| 4,576,698 | 3/1986 | Gallagher et al. | 204/192 |
| 4,634,331 | 1/1987 | Hertel . | |
| 4,643,629 | 2/1987 | Takahashi et al. | 414/331 |
| 4,705,951 | 11/1987 | Layman et al. . | |
| 4,715,764 | 12/1987 | Hutchinson . | |
| 4,824,309 | 4/1989 | Kakehi et al. | 414/217 |
| 4,836,733 | 6/1989 | Hertel et al. . | |
| 4,836,905 | 6/1989 | Davis et al. . | |
| 4,851,101 | 7/1989 | Hutchinson . | |
| 4,895,107 | 1/1990 | Yano et al. . | |
| 4,902,934 | 2/1990 | Miyamura et al. . | |
| 4,903,937 | 2/1990 | Jakuniec et al. . | |
| 4,909,695 | 3/1990 | Hurwitt et al. . | |
| 4,911,597 | 3/1990 | Maydan et al. . | |
| 4,915,564 | 4/1990 | Eror et al. . | |
| 4,917,556 | 4/1990 | Stark et al. . | |
| 4,924,890 | 5/1990 | Giles et al. | 134/902 |
| 4,936,329 | 6/1990 | Michael et al. | 134/902 |
| 4,951,601 | 8/1990 | Maydan et al. | 414/217 X |
| 5,007,981 | 4/1991 | Kawasaki et al. . | |
| 5,014,217 | 5/1991 | Savage | 364/550 |
| 5,292,393 | 3/1994 | Maydan et al. . | |
| 5,351,415 | 10/1994 | Brooks et al. | 34/389 |
| 5,452,166 | 9/1995 | Aylwin et al. . | |
| 5,462,397 | 10/1995 | Iwabuchi | 414/222 |
| 5,504,033 | 4/1996 | Bajor et al. . | |
| 5,504,347 | 4/1996 | Jovanovic et al. . | |
| 5,509,771 | 4/1996 | Hiroki | 414/217 |
| 5,556,714 | 9/1996 | Fukuyama et al. . | |
| 5,651,858 | 7/1997 | Lin . | |
| 5,675,461 | 10/1997 | Aylwin et al. . | |
| 5,685,684 | 11/1997 | Kato et al. | 414/217 |

FOREIGN PATENT DOCUMENTS

| | | |
|---|---|---|
| 1135015 | 5/1989 | Japan . |
| 1298180 | 12/1989 | Japan . |
| 265252 | 3/1990 | Japan . |
| 294647 | 4/1990 | Japan . |
| 430549 | 4/1992 | Japan . |
| 8707309 | 5/1987 | WIPO . |

VACUUM PROCESSING APPARATUS AND OPERATING METHOD THEREFOR

This application is a Continuation of application Ser. No. 09/061,062, filed Apr. 16, 1998, which is a Continuation application of Ser. No. 08/882,731, filed Jun. 26, 1997, U.S. Pat. No. 5,784,799, which is a Divisional application of Ser. No. 08/593,870, filed Jan. 30, 1996, U.S. Pat. No. 5,661,913 which is a Continuing application of Ser. No. 08/443,039, filed May 17, 1995, U.S. Pat. No. 5,553,396, which is a Divisional application of Ser. No. 08/302,443, filed Sep. 9,1994, U.S. Pat. No. 5,457,896, which is a Continuing application of Ser. No. 08/096,256, filed Jul. 26, 1993, U.S. Pat. No. 5,349,762 which is a Continuing application of Ser. No. 07/751,951, filed Aug. 29, 1991 U.S. Pat. No. 5,314,509.

BACKGROUND OF THE INVENTION

1. Field of the Invention

This invention relates to a vacuum processing apparatus and operating method therefor. More specifically, the present invention relates to a vacuum processing apparatus having vacuum processing chambers the inside of which must be cleaned, and its operating method.

2. Description of the Prior Art

In a vacuum processing apparatus such as a dry etching apparatus, a CVD apparatus or a sputtering apparatus, a predetermined number of substrates to be treated are stored as one unit (which is generally referred to as a "lot") in a substrate cassette and are loaded in the apparatus. The substrates after being are loaded in the apparatus. The substrates after being processed are likewise stored in the same unit in the substrate cassette and are recovered. This is an ordinary method of operating these apparatuses to improve the productivity.

In such a vacuum processing apparatus described above, particularly in an apparatus which utilizes a reaction by an active gas, as typified by a dry etching apparat us and a CVD apparatus, reaction products adhere to and are deposited on a vacuum processing chamber with the progress of processing. For this reason, problems such as degradation of vacuum performance, the increase of dust, the drop of the levels of optical monitoring signals occur. To solve these problems, conventionally the insides of the vacuum processing chambers are cleaned periodically. Cleaning operations include so-called "wet cleaning" which is wiping-off of the adhering matters by use of an organic solvent, etc., and so-called "dry cleaning" in which an active gas or plasma is used for decomposing adhering matters. Dry cleaning is superior from the aspect of the working factor and efficiency. These features of the dry cleaning have become essential with the progress in automation of production lines.

An example of vacuum processing apparatuses having such a dry cleaning function is disclosed in Japanese Utility Model Laid-Open No. 127125/1988.

This apparatus includes a preliminary vacuum chamber for introducing wafers to be treated into a processing chamber from an atmospheric side to a vacuum side, which is disposed adjacent to the processing chamber through a gate valve, dummy wafers are loaded in the preliminary vacuum chamber and are transferred into the processing chamber by exclusive conveyor means before the processing chamber is subjected to dry cleaning, and the dummy wafer is returned to the vacuum preparatory chamber by the conveyor means after dry cleaning is completed.

SUMMARY OF THE INVENTION

In the prior art technology described above, the structure of the vacuum processing apparatus is not much considered. The preliminary vacuum chamber for storing the dummy wafers must have a large capacity, the exclusive conveyor means is necessary for transferring the dummy wafers and thus, the apparatus is complicated in structure.

Dummy wafers used for plasma cleaning are again returned to the preliminary vacuum chamber and are made to stand by. In this instance, reaction products generated during plasma cleaning and residual gas used for plasma cleaning adhere on the used dummy wafers. Thereafter, normal processing for wafers is resumed. Therefore, the used dummy wafers and unprocessed wafers exist in mixture inside the preliminary vacuum chamber and this state is not desirable from the aspect of contamination of unprocessed wafers.

The present invention provides a vacuum processing apparatus which solves the problems described above, is simple in structure, prevents contamination of unprocessed substrates and accomplishes a high production yield. A vacuum processing apparatus having vacuum processing chambers the insides of which are dry-cleaned after substrates to be treated are processed in vacuum is provided with first storage means or storing substrates to be treated, second storage means for storing dummy substrates, the first and second storage means being disposed in the air, conveyor means for transferring the substrates to be processed between the first storage means and the vacuum processing chambers and for transferring the dummy substrates between the second storage means and the vacuum processing chambers, and control means for controlling the conveyor means so as to transfer the dummy substrates between the second storage means and the vacuum processing chambers before and after dry cleaning of the vacuum processing chambers. A method of operating a vacuum processing apparatus having vacuum processing chambers the insides of which are dry-cleaned after substrates to be processed are processed in vacuum comprises the steps of disposing first storage means for storing the substrates to be processed together with second storage means for storing dummy substrates in the air atmosphere, transferring the substrates to be processed between the first storage means and the vacuum processing chambers and vacuum-processing the substrates to be processed, and transferring the dummy substrates between the second storage means and the vacuum processing chambers before and after dry-cleaning of the vacuum processing chambers.

DESCRIPTION OF THE PREFERRED EMBODIMENTS

As substrates to be processed are processed in a vacuum processing apparatus, reaction products adhere to and are deposited in vacuum processing chambers. The reaction products adhering to and deposited in the vacuum processing chambers are removed by disposing dummy wafers inside the vacuum processing chambers and by conducting dry-cleaning. To carry out dry cleaning, the timings of dry cleaning of the vacuum processing chambers are determined and during or after the processing of a predetermined number of substrates to be processed, dummy substrates are conveyed by substrate conveyor means from dummy substrate storage means disposed in the air atmosphere together with processed substrate storage means, and are then disposed inside the vacuum processing chambers. After the dummy substrates are thus disposed, a plasma is generated inside each of the vacuum processing chambers to execute dry-cleaning inside the vacuum processing chamber. After dry-cleaning inside the vacuum processing chambers is completed, the dummy substrates are returned from the vacuum processing chambers to the dummy substrate storage means by the substrate conveyor means. In this manner, a preliminary vacuum chamber and an exclusive transfer mechanism both necessary in prior art techniques become unnecessary, and the apparatus structure gets simplified. The dummy substrates used for the dry-cleaning and the substrates to be processed do not co-exist inside the same chamber, so that contamination of substrates to be processed due to dust and remaining gas is prevented and a high production yield can be achieved.

Hereinafter, an embodiment of the present invention will be explained with reference to FIGS. 1 and 2.

Figure 1:
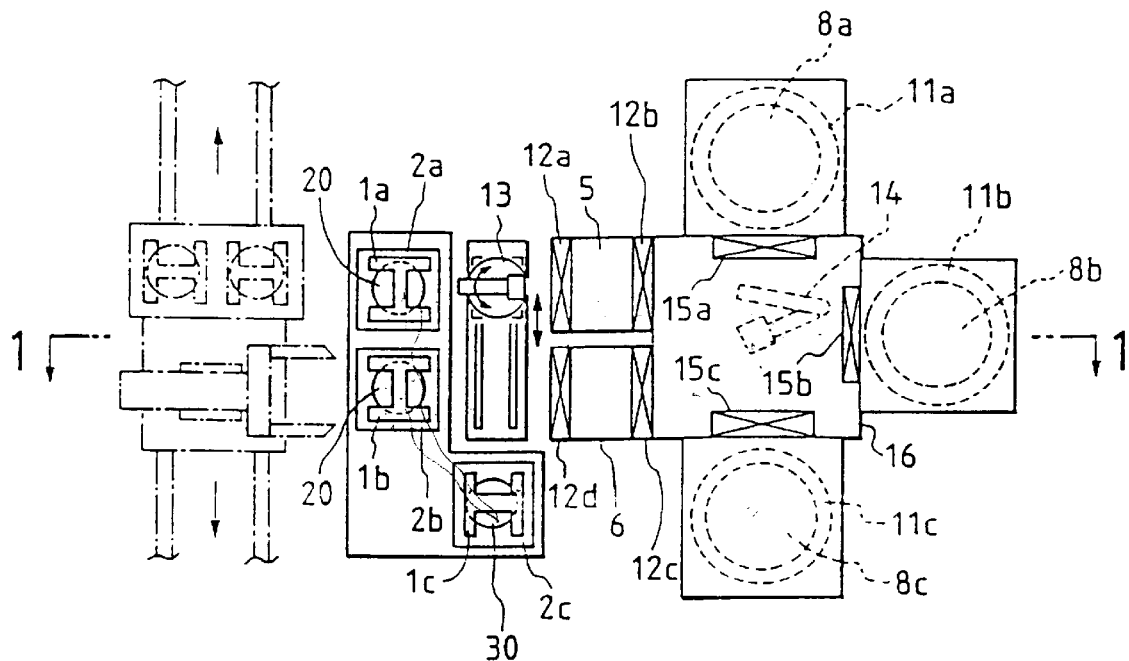
FIG. 1 is a plan view of a dry etching apparatus as an embodiment of a vacuum processing apparatus in accordance with the present invention.
Figure 2:
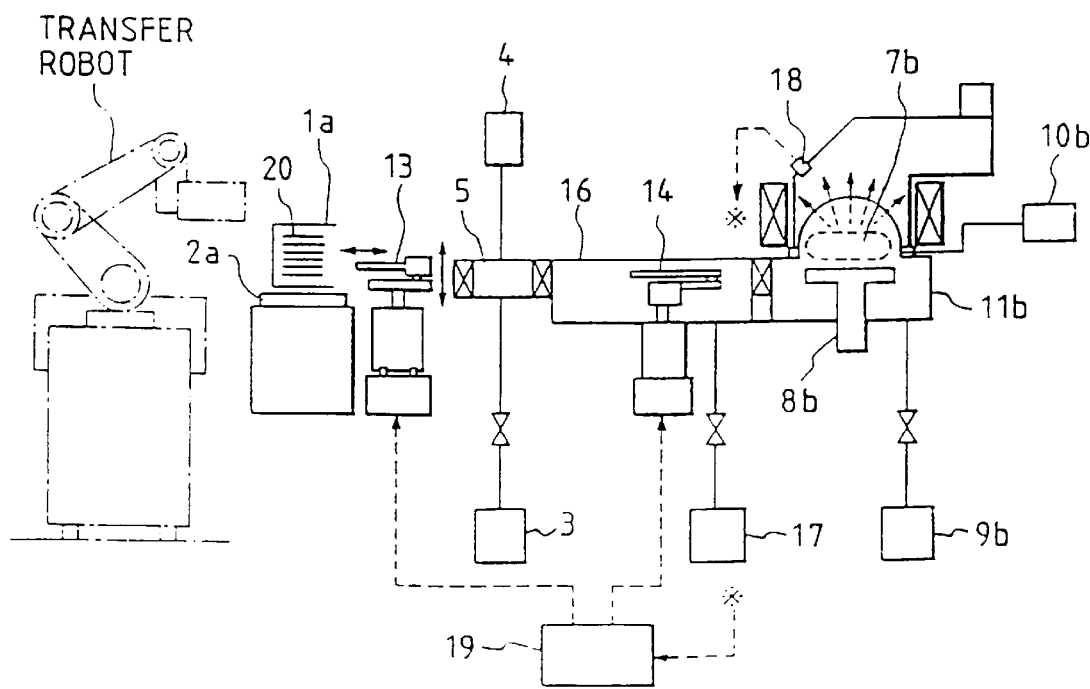
FIG. 2 is a vertical sectional view taken along line 1—1 of FIG. 1.

FIGS. 1 and 2 show a vacuum processing apparatus of the present invention which is, in this case, a dry-etching apparatus for etching wafers, i.e., substrates to be processed by plasma.

Cassette tables $2a$ to $2c$ are disposed in an L-shape in this case in positions such that they can be loaded into and unloaded from the apparatus without changing their positions and postures. In other words, the cassettes $1a$ to $1c$ are fixed always in predetermined positions on a substantially horizontal plane, while the cassette tables $2a$ and $2b$ are disposed adjacent to and in parallel with each other on one of the sides of the L-shape. The cassette table $2c$ is disposed on the other side of the L-shape. The cassettes $1a$ and $1b$ are for storing unprocessed wafers and for recovering the processed wafers. They can store a plurality (usually 25) of wafers 20 as the substrates to be treated. The cassette $1c$ in this case is for storing the dummy wafers for effecting dry-cleaning using plasma (hereinafter referred to as "plasma-cleaning") and recovering the dummy wafers after plasma-cleaning. It can store a plurality of (usually twenty-five pieces) dummy wafers 30.

A load lock chamber 5 and unload lock chamber 6 are so disposed as to face the cassette tables $2a$ and $2b$, and a conveyor 13 is disposed between the cassette tables $2a$, $2b$ and the load lock chamber 5 and the unload lock chamber 6. The load lock chamber 5 is equipped with an evacuating device 3 and a gas introduction device 4, and can load unprocessed wafers in the vacuum apparatus through a gate valve $12a$. The unload lock chamber 6 is similarly equipped with the evacuating device 3 and the gas introduction device 4, and can take out processed wafers to the atmosphere through a gate valve $12d$. The conveyor 13 is equipped with a robot having X, Y, Z and θ axes, which operates so as to deliver and receive the wafers 20 between the cassettes $1a$, $1b$ and the load lock and unload lock chambers 5 and 6 and the dummy wafers 30 between the cassette $1c$ and the load lock and unload lock chambers 5 and 6.

The load lock chamber 5 and the unload lock chamber 6 are connected to a transfer chamber 16 through the gate valves $12b$ and $12c$. The transfer chamber 16 is rectangular, in this case, and etching chambers $11a$, $11b$ and $11c$ are disposed on the three side walls of the transfer chamber 16 through gate valves $15a$, $15b$ and $15c$, respectively. A conveyor 14 capable of delivering the wafers 20 or the dummy wafers 30 from the load lock chamber 5 to the etching chambers $11a$, $11b$, $11c$ and of delivering them from the chambers $11a$, $11b$, $11c$ to the unload lock chamber 6 is disposed inside the transfer chamber 16. The transfer chamber 16 is equipped with an evacuating device 17 capable of independent evacuation.

The etching chambers $11a$, $11b$, $11c$ have the same structure and can make the same processing. The explanation will be given on the etching chamber $11b$ by way of example. The etching chamber $11b$ has a sample table $8b$ for placing the wafers 20 thereon, and a discharge chamber is so provided as to define a discharge portion $7b$ above the sample table $8b$. The etching chamber $11b$ includes a gas introduction device $10b$ for introducing a processing gas in the discharge portion $7b$ and an evacuating device $9b$ for decreasing the internal pressure of the etching chamber $11b$ to a predetermined pressure. The etching chamber $11b$ further includes generation means for generating a microwave and a magnetic field for converting processing gas in the discharge portion $7b$ to plasma.

A sensor 18 for measuring the intensity of plasma light is disposed at an upper part of the etching chamber. The measured value of the sensor 13 is inputted to a controller 19. The controller 19 compares the measured value from the sensor 18 with a predetermined one and determines the timing of cleaning inside the etching chamber. The controller 19 controls the conveyors 13 and 14 to control the transfer of the dummy wafers 30 between the cassette $1c$ and the etching chambers $11a$ to $11c$.

In a vacuum processing apparatus having the construction described above, the cassettes $1a$, $1b$ storing unprocessed wafers are first placed onto the cassette tables $2a$, $2b$ by a line transfer robot which operates on the basis of the data sent from a host control apparatus, or by an operator. On the other hand, the cassette $1c$ storing the dummy wafers is placed on the cassette table $2c$. The vacuum processing apparatus executes the wafer processing or plasma cleaning on the basis of recognition by itself of the production data provided on the cassettes $1a$ to $1c$, of the data sent from the host control apparatus, or of the command inputted by an operator.

For instance, the wafers 20 are sequentially loaded in the order from above into the etching chambers $11a$, $11b$, $11c$ by the conveyors 13 and 14, and are etched. The etched wafers are stored in their original positions inside the cassette $1a$ by the conveyors 14 and 13. In this case, from the start to the end of the operation, without changing the position and posture of the cassettes, the unprocessed wafers are taken out from the cassettes and are returned in their original positions where the wafers have been stored, and are stored there. In this manner, the apparatus can easily cope with automation of the production line, contamination of the wafers due to dust can be reduced and high production efficiency and high production yield can thus be accomplished.

As etching is repeated, the reaction products adhere to and are deposited on the inner wall of the etching chambers $11a$ to $11c$. Therefore, the original state must be recovered by removing the adhering matters by plasma cleaning. The controller 19 judges the timing of this plasma cleaning. In this case, a portion through which the plasma light passes is provided in each of the etching chambers $11a$ to $11c$. The sensor 18 measures the intensity of the plasma light passing through this portion and when the measured value reaches a predetermined one, the start timing of plasma cleaning is judged. Alternatively, the timing of plasma cleaning may be judged by counting the number of wafers processed in each etching chamber by the controller 19 and judging the timing when this value reaches a predetermined value. The actual timing of plasma cleaning that is carried out may be during a processing of a predetermined number of wafers in the cassette 1a or 1b, after the processing of all the wafers 20 in a cassette is completed and before the processing of wafers in the next cassette.

Plasma cleaning is carried out in the following sequence. In this case, the explanation will be given about a case where the etching chambers 11a to 11c are subjected to plasma cleaning by using three dummy wafers 30 among the dummy wafers 30 (twenty-five dummy wafers are stored in this case) stored in the cassette 1c.

Dummy wafers 30 which are stored in the cassette 1c and are not used yet or can be used because the number of times of use for plasma cleaning is below a predetermined one are drawn by the conveyor 13. At this time, dummy wafers 30 stored in any position in the cassette 1c may be used but in this case, the position numbers of the dummy wafers in the cassette and their number of times of use are stored in the controller 19, and accordingly dummy wafers having smaller numbers of times of use are drawn preferentially. Then, the dummy wafers 30 are loaded in the load lock chamber 5 disposed on the opposite side to the cassette 1a by the conveyor 13 through the gate valve 12a in the same way as the transfer at the time of etching of wafers 20. After the gate valve 12a is closed, the load lock chamber 5 is evacuated to a predetermined pressure by the vacuum exhaust device 3 and then the gate valves 12b and 15a are opened. The dummy wafers 30 are transferred by the conveyor 14 from the load lock chamber 5 to the etching chamber 11a through the transfer chamber 16 and are placed on the sample table 8a. After the gate valve 15a is closed, plasma cleaning is carried out in the etching chamber 11a in which the dummy wafers 30 are disposed, under a predetermined condition.

In the interim, the gate valves 12a, 12b are closed and the pressure of the load lock chamber 5 is returned to the atmospheric pressure by the gas introduction device 4. Next, the gate valve 12a is opened and the second dummy wafer 30 is loaded in the load lock chamber 5 by the conveyor 13 in the same way as the first dummy wafer 30, and evacuation is effected again by the evacuating device 3 to a predetermined pressure after closing the gate valve 12a. Thereafter, the gate valves 12b and 15b are opened and the second dummy wafer 30 is transferred from the load lock chamber 5 to the etching chamber 11b through the transfer chamber 16 by the conveyor 14. Plasma cleaning is started after the gate valve 15b is closed.

In the interim, the third dummy wafer 30 is transferred into the etching chamber 11c in the same way as the second dummy wafer 30 and plasma cleaning is carried out.

After plasma cleaning is completed in the etching chamber 11a in which the first dummy wafer 20 is placed, the gate valves 15a and 12c are opened. The used dummy wafer 30 is transferred from the etching chamber 11a to the unload lock chamber 6 by the conveyor 14. Then, the gate valve 12c is closed. After the pressure of the unload lock chamber 6 is returned to the atmospheric pressure by the gas introduction device 4, the gate valve 12d is opened. The used dummy wafer 30 transferred to the unload lock chamber 6 is taken out in the air by the conveyor 13 through the gate valve 12d and is returned to its original position in the cassette 1c in which it is stored at the start.

When plasma cleaning of the etching chambers 11b and 11c is completed, the second and third dummy wafers 20 are returned to their original positions in the cassette 1c.

In this way, the used dummy wafers 30 are returned to their original positions in the cassette 1c and the dummy wafers 30 are always stocked in the cassette 1c. When all the dummy wafers 30 in the cassette 1c are used for plasma cleaning or when the numbers of times of use of the wafers 30 reach the predetermined ones after the repetition of use, the dummy wafers 30 are replaced as a whole together with the cassette 1c. The timing of this replacement of the cassette is managed by the controller 19 and the replacement is instructed to the host control apparatus for controlling the line transfer robot or to the operator.

Although the explanation given above deals with the case where the etching chambers 11a to 11c are continuously plasma-cleaned by the use of three dummy wafers 30 among the dummy wafers 30 in the cassette 1c, other processing methods may be employed, as well.

For example, the etching chambers 11a to 11c are sequentially plasma-cleaned by the use of one dummy wafer 30. In the case of such plasma cleaning, unprocessed wafers 20 can be etched in etching chambers other than the one subjected to plasma cleaning, and plasma cleaning can thus be carried out without interrupting etching.

If the processing chambers are different, for example, there are an etching chamber, a post-processing chamber and a film-formation chamber, and wafers are sequentially processed while passing through each of these processing chambers, each of the processing chambers can be subjected appropriately to plasma cleaning by sending dummy wafers 30 during the processing of the wafers 20 which are stored in the cassette 1a or 2a and drawn and sent sequentially, by passing merely the dummy wafers 30 through the processing chambers for which plasma cleaning is not necessary, and by executing plasma cleaning only when the dummy wafers 30 reach the processing chambers which need plasma cleaning.

According to the embodiment described above, the cassette storing the dummy wafers and the cassettes storing the wafers to be processed are disposed together in the air, the dummy wafers are loaded from the cassette into the apparatus by the same conveyor as the conveyor for transferring the wafers, at the time of cleaning, and the used dummy wafers are returned to their original positions in the cassette. In this way, a mechanism For conducting exclusively plasma cleaning need not be provided, and the construction of the apparatus can be simplified. It is not necessary to handle plasma cleaning as a particular processing sequence, but the plasma cleaning can be incorporated in an ordinary etching processing and can be carried out efficiently in a series of operations.

The dummy wafers used for plasma cleaning are returned to their original positions in the cassette placed in the air. Accordingly, the used dummy wafers and the wafers before and after processing do not exist mixedly in the vacuum chamber, so that contamination of wafers due to dust and remaining gas does not occur unlike conventional apparatuses.

The used dummy wafers are returned to their original positions in the cassette and the numbers of times of their use is managed. Accordingly, it is possible to prevent the confusion of the used dummy wafers with the unused dummy wafers and the confusion of the dummy wafers having small numbers of times of use with the dummy wafers having large numbers of times or use. For these reasons, the dummy wafers can be used effectively without any problem when plasma cleaning is carried out.

Furthermore, in accordance with the present invention, the apparatus can have a plurality of processing chambers and can transfer wafers and dummy wafers by the same conveyor. Since plasma cleaning can be carried out by managing the timing of cleaning of each processing chamber by the controller, the cleaning cycle can be set arbitrarily, dry cleaning can be carried out without interrupting the flow of the processing, the processing can be efficiently made and the productivity can be improved.

As described above, according to the present invention, there are effects that the construction of the apparatus is simple, the substrates to be processed are free from contamination and the production yield is high.

What is claimed is:

1. A conveyor system for use in a vacuum processing apparatus, comprising:

an atmospheric loader, exposed to the air;

a vacuum loader; and a lock chamber, having an atmospheric loader side and a vacuum loader side, and having a gate valve for said atmospheric loader side and another gate valve for said vacuum loader side, wherein said vacuum loader has
    (1) a transfer chamber connected to the lock chamber via the another gate valve,
    (2) a conveyor structure, and
    (3) plural vacuum processing chamber installation portions, and wherein a substrate is processed one by one in at least one of the plural vacuum processing chamber installation portions.

2. The conveyor system according to claim 1, further comprising a conveyor to transfer substrates directly from the atmospheric loader to the lock chamber.

3. The conveyor system according to claim 1, wherein a substrate is processed one by one in each of the plural vacuum processing chamber installation portions.

4. A conveyor system for use in a vacuum processing apparatus, comprising:

an atmospheric loader, exposed to the air;

a vacuum loader; and a lock chamber, having an atmospheric loader side closest to the atmospheric loader and a vacuum loader side closest to the vacuum loader, and having a gate valve for said atmospheric loader side and another gate valve for said vacuum loader side, wherein said vacuum loader has
    (1) a transfer chamber connected to the lock chamber via the another gate valve,
    (2) a conveyor structure, and
    (3) plural vacuum processing chamber installation portions, and wherein said lock chamber and at least one of said plural vacuum processing chamber installation portions are located such that a substrate to be processed is carried in and carried out between said lock chamber and at least one of said plural vacuum processing chamber installation portions via said transfer chamber.

5. The conveyor system according to claim 4, further comprising a conveyor to transfer substrates directly from the atmospheric loader to the lock chamber.

6. A conveyor system for transferring substrates directly to be processed to a vacuum processing apparatus, comprising:

first means for transferring substrates, to be processed in the vacuum processing apparatus, from an atmospheric loader, which is exposed to the air, to a lock chamber, said first means being a means for transferring the substrates one by one;

means for providing a vacuum in the lock chamber; and second means for transferring substrates, between the lock chamber and a vacuum loader, for loading the substrates into the vacuum processing apparatus, said second means transferring the substrates through gate valves of the vacuum loader.

7. The conveyor system according to claim 6, further comprising said atmospheric loader, said lock chamber and said vacuum loader, said vacuum loader having a transfer chamber, the second means for transferring acting to transfer the substrates between the lock chamber and the transfer chamber of the vacuum loader, via the gate valves, for loading the substrates into the vacuum processing apparatus.

8. The conveyor system according to claim 7, wherein said second means for transferring is a means for transferring the substrates one by one between the lock chamber and the transfer chamber, for loading the substrates into the vacuum processing apparatus.

9. The conveyer system according to claim 6, wherein said first means transfers the substrates directly from the atmospheric loader to the lock chamber.

10. Apparatus for carrying out a method including the steps of:

(i) placing a cassette containing wafers to be processed at a cassette table which is in the atmosphere;

(ii) loading said wafers sequentially in order from said cassette by means of a first conveyor in the atmosphere, a load lock chamber and a second conveyor in a transfer chamber under vacuum, into a plurality of vacuum processing chambers connected to said transfer chamber;

(iii) processing said wafers under vacuum in said vacuum processing chambers; and (iv) unloading vacuum processed wafers from said vacuum processing chambers into said cassette at said cassette table, by means of a second conveyor in said transfer chamber under vacuum, an unload lock chamber and said first conveyor in the atmosphere, said apparatus comprising:

a cassette table exposed to the air, for disposing cassettes containing wafers to be processed, the cassettes being disposed in a row in front of the load and unload lock chambers;

a transfer chamber which in use is held under vacuum;

a plurality of vacuum processing chambers connected to said transfer chamber;

load lock/unlock chambers in which wafers are transferred from the atmosphere to vacuum and from vacuum to the atmosphere;

a first conveyor, adapted to load wafers sequentially from a cassette at said cassette table into said load lock/unlock chambers and to unload processed wafers sequentially from said load lock/unlock chambers into said cassette at said cassette table; and a second conveyor maintained in said transfer chamber under vacuum, for transferring said wafers between said load lock/unlock chambers and said vacuum processing chambers.

11. Apparatus according to claim 10, wherein said transfer chamber has an evacuating device operable independently of evacuating devices for said vacuum processing chambers.

12. Apparatus according to claim 10, wherein said first conveyor is maintained in the air.

13. Apparatus according to claim 10, wherein the first conveyor loads wafers directly from said cassette into said load lock/unlock chambers.

14. A vacuum processing apparatus, comprising:

an atmospheric loader, exposed to the air;

a vacuum loader; and a lock chamber for connecting said atmospheric loader and said vacuum loader, wherein said atmospheric loader includes a cassette mount unit located outside of said lock chamber, said cassette mount unit has a cassette positioning plane which is a substantially horizontal plane in which all cassettes, containing samples to be processed, exposed to the air, are positioned in a row in front of a front wall of said lock chamber, and said cassette positioning plane is oriented such that a cassette is placed on and removed from said cassette positioning plane so as to maintain a surface sample to be processed, of a sample in said cassette, substantially horizontal when the cassette containing the sample is on the cassette positioning plane.

15. The vacuum processing apparatus according to claim 14, wherein said vacuum loader has a convey chamber, a conveyor structure and plural vacuum processing chambers.

16. The vacuum processing apparatus according to claim 14, further comprising an automatic cassette loader for loading cassettes into the atmospheric loader, wherein said automatic cassette loader loads cassettes into the atmospheric loader so as to maintain the sample surface substantially horizontal.

17. The vacuum processing apparatus according to claim 14, wherein all of said cassettes are positioned in a line in said cassette positioning plane, in front of a front wall of said lock chamber.

18. The vacuum processing apparatus according to claim 14, further comprising a conveyor for conveying samples to be processed, from said atmospheric loader to said lock chamber.

19. The vacuum processing apparatus according to claim 18, wherein said vacuum loader has a convey chamber, a conveyor structure and plural vacuum processing chambers.

20. The vacuum processing apparatus according to claim 19, further comprising an automatic cassette loader for loading cassettes into the atmospheric loader, wherein said automatic cassette loader loads cassettes into the atmospheric loader so as to maintain the sample surface substantially horizontal.

21. The vacuum processing apparatus according to claim 18, further comprising an automatic cassette loader for loading cassettes into the atmospheric loader, wherein said automatic cassette loader loads cassettes into the atmospheric loader so as to maintain the sample surface substantially horizontal.

22. The vacuum processing apparatus according to claim 18, wherein said conveyor conveys samples directly from said atmospheric loader to said lock chamber.

23. A vacuum processing apparatus, comprising:

a first loader, to be operated at atmospheric pressure, exposed to the air;

a second loader to be operated at vacuum; and a lock chamber for connecting said first loader and said second loader, wherein said first loader includes a cassette mount unit located outside of said lock chamber, said cassette mount unit has a cassette positioning plane which is a substantially horizontal plane in which all cassettes, containing substrates to be processed, and exposed to the air, are positioned in a row in front of a front wall of said lock chamber, and said cassette positioning plane is oriented such that a cassette is placed on and removed from said cassette positioning plane so as to maintain a surface to be processed, of a substrate in said cassette, substantially horizontal when the cassette containing the substrate is on the cassette positioning plane.

24. The vacuum processing apparatus according to claim 23, further comprising a conveyor for transferring substrates to be processed directly from the first loader to the lock chamber.

25. A vacuum processing apparatus, comprising:

a first loader, to be operated in an atmosphere different from an atmosphere in a vacuum processing chamber, exposed to the air;

a second loader to be operated in said atmosphere in said vacuum processing chamber; and a lock chamber for connecting said first loader and said second loader, wherein said first loader includes a cassette mount unit located outside of said lock chamber, said cassette mount unit has a cassette positioning plane which is a substantially horizontal plane in which all cassettes, containing substrates to be processed, and exposed to the air, are positioned in a row in front of a front wall of said lock chamber, and said cassette positioning plane is oriented such that a cassette is placed on and removed from said cassette positioning plane so as to maintain a surface to be processed, of a substrate in said cassette, substantially horizontal when the cassette containing the substrate is on the cassette positioning plane.

26. The vacuum processing apparatus according to claim 25, further comprising a conveyor for transferring substrates to be processed directly from the first loader to the lock chamber.

27. A vacuum processing apparatus, comprising:

a first loader, to be operated in an atmosphere, exposed to the air;

a second loader to be operated in a vacuum; and a lock chamber for connecting said first loader and said second loader, wherein said first loader includes a cassette mount unit located outside of said lock chamber, said cassette mount unit has a cassette positioning plane which is a substantially horizontal plane in which all cassettes, containing substrates to be processed, and exposed to the air, are positioned in a row in front of a front wall of said lock chamber, and said cassette positioning plane is oriented such that a cassette is placed on and removed from said cassette positioning plane so as to maintain a surface to be processed, of a substrate in said cassette, substantially horizontal when the cassette containing the substrate is on the cassette positioning plane.

28. The vacuum processing apparatus according to claim 27, further comprising a conveyor for transferring substrates to be processed directly from the first loader to the lock chamber.

29. A vacuum processing apparatus, comprising:

an atmospheric loader, exposed to a cassette transferring atmospheric pressure;

a vacuum loader; and a lock chamber for connecting said atmospheric loader and said vacuum loader, wherein said atmospheric loader includes a cassette mount unit located outside of said lock chamber, said cassette mount unit has a cassette positioning plane which is a substantially horizontal plane in which all cassettes, containing samples to be processed, exposed to the air, are positioned in a row in front of a front wall of said lock chamber, and said cassette positioning plane is oriented such that a cassette is placed on and removed from said cassette positioning plane so as to maintain a surface sample to be processed, of a sample in said cassette, substantially horizontal when the cassette containing the sample is on the cassette positioning plane.

* * * * *